United States Patent [19]

Shackford

[11] 4,205,520
[45] Jun. 3, 1980

[54] KEY-OPERATED COVER RESET MECHANISM FOR TIME SWITCH CLOCK OF A TIME SWITCH AND WATTHOUR METER OR THE LIKE

[75] Inventor: Ernest B. Shackford, Durham, N.H.

[73] Assignee: General Electric Company, N.Y.

[21] Appl. No.: 892,289

[22] Filed: Mar. 31, 1978

[51] Int. Cl.² .................. G04F 8/00; G04B 13/00; G04B 37/12
[52] U.S. Cl. .................. 368/108; 58/21.15; 58/152 R; 324/144; 368/262; 368/10
[58] Field of Search ............ 58/16, 19 R, 21.13, 58/21.15, 21.155, 39.5, 145 R, 146, 147, 152R; 324/144, 181

[56] References Cited

U.S. PATENT DOCUMENTS

| 2,244,924 | 6/1941 | Thorson | 58/21.155 |
| 2,541,817 | 2/1951 | Gordon | 58/21.155 |
| 2,543,946 | 3/1951 | Tener | 58/146 |
| 2,604,940 | 7/1952 | Heptinstall | 58/146 |

*Primary Examiner*—Vit W. Miska
*Attorney, Agent, or Firm*—Francis X. Doyle; Richard A. Menelly

[57] ABSTRACT

A watt-hour meter including a time switch and clock dial is provided with a key-operated rotary reset actuator mounted on the cover, in which a key is utilized to allow the rotary reset actuator to be extended into the meter behind the cover in contact with the reset member of time switch clock dial for resetting of such clock dial.

1 Claim, 4 Drawing Figures

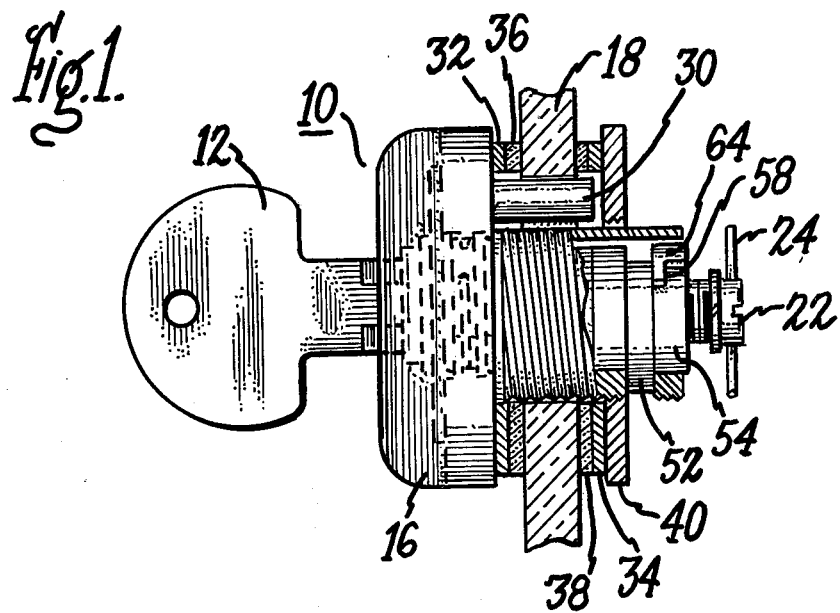
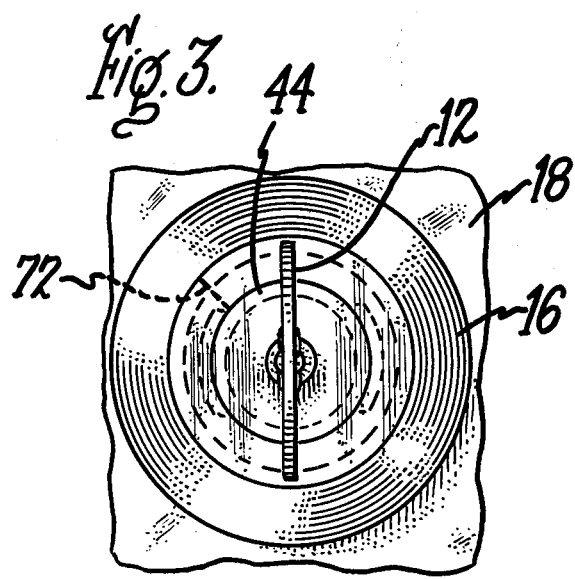
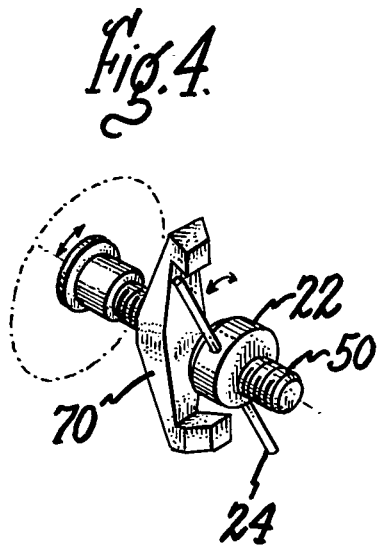

KEY-OPERATED COVER RESET MECHANISM FOR TIME SWITCH CLOCK OF A TIME SWITCH AND WATTHOUR METER OR THE LIKE

BACKGROUND OF THE INVENTION

My invention relates to killowatt-hour meters and more particularly, to a cover-mounted rotary-reset actuator wherein a lock is provided and a key is utilized actuating the lock to allow a rotary actuator to be extended into the time switch and clock dial of the watt-hour meter through the cover thereof and allows rotary motion of such actuator for resetting of the time switch clock dial.

Kilowatt-hour meters are well known in the prior art. A common type of meter currently in use by the electric utility industry has a conventional watt-hour meter mechanism which is used in combination with a time switch and a time clock for actuating the time switch. Generally a separate motor is provided for running the clock and the switch is actuated by means of various cams located about the time or clock dial. After a power outage, it normally is required that the time or clock dial be reset to the accurate time so that actuation of the time switch will continue in the desired preset period. As is well known, for example, in many electric homes, a time switch is utilized for controlling the water heater element of an electric water heater. In some instances, for example at certain periods of the day which are usually considered the peak periods, the time switch will be acutated by means of the clock to turn off the power from at least one element of the electric water heater. As will be apparent if a power outage occurs whereby the time clock is off, for example, for a period of six hours, when power is again returned it will be clear that the time clock is now six hours off and, therefore, would be turning on and off the electric water heater at undesired periods, such as, at peak use rather than at desired periods of low electric use. For this reason it is necessary that where electric time switches are utilized with watt-hour meters, that after a power outage means be provided for resetting the clocks on the time switch.

Of course, as is well known to those skilled in the art in many areas people often tampered with the meters. It is necessary that the meters be sealed to their base so that tampering can be readily recognized by inspection of the seal. However, in an instance of a power outage it is desired to be able to reset the time clock without the necessity of unsealing the meter. For this reason it is desired that a time clock reset mechanism be provided which is mounted on the cover of a watt-hour meter and be actuated such that, when desired, the time clock can be reset to the desired time without opening up the meter. However, it is generally considered undesirable to have an actuator on the outside of the meter which could be maneuvered by an unauthorized person. Therefore, it is desirable that any resetting mechanism for the time clock be provided with a key-actuated resetting means such that unauthorized persons may not reset the mechanism.

It is, therefore, a primary object of this invention to provide a cover-mounted reset actuator for a time switch clock wherein a key is utilized for actuation of the time clock reset mechanism.

A further object of this invention is to provide a meter cover which has a reset actuator mounted thereon and which provides complete 360° rotary motion for resetting of the time clock.

A further object of the invention is to provide a cover-mounted reset actuator wherein a key actuates the actuator to move it inwardly into contact with an internal reset mechanism for a time clock.

SUMMARY OF THE INVENTION

In carrying out this invention in one form a key-actuated reset mechanism is mounted on a cover of a watt-hour meter which is provided with a time switch. The reset actuator has a member extending internally of the meter cover and in a position to engage the time clock reset member, when the cover actuator member is moved inwardly into the meter cover. The key actuation of the reset actuator allows a portion of the actuator to drop or move into the cover where a member engages the reset mechanism of the time clock and allows it to be reset to the desired time period. At this point the actuator may be lifted by the key and returned to a locked position where the reset mechanism does not interfere with the reset member on the time clock.

The invention which is sought to be protected will be particularly pointed out and distinctly claimed in the claims appended hereto. However, it is believed that this invention, and the manner in which its various objects and advantages are obtained, as well as other objects and advantages thereof, will be more readily understood by reference to the following detailed description of a preferred embodiment thereof, particularly when considered in the light of the accompanying drawings.

BRIEF DESCRIPTION OF THE DRAWINGS

FIG. 1 is a side elevation, partly in section, of the key-operated reset actuator of a preferred form of this invention showing the key inserted and the reset actuator mounted on a meter cover;

FIG. 3 is a front view of the key-operated reset actuator of this invention showing one of the indication lines on the lock mechanism; and FIG. 4 is a partial perspective view showing the actuator of the key-operated member and the actuator of the time clock in their engaged position.

DESCRIPTION OF THE PREFERRED EMBODIMENT

Figure 2:
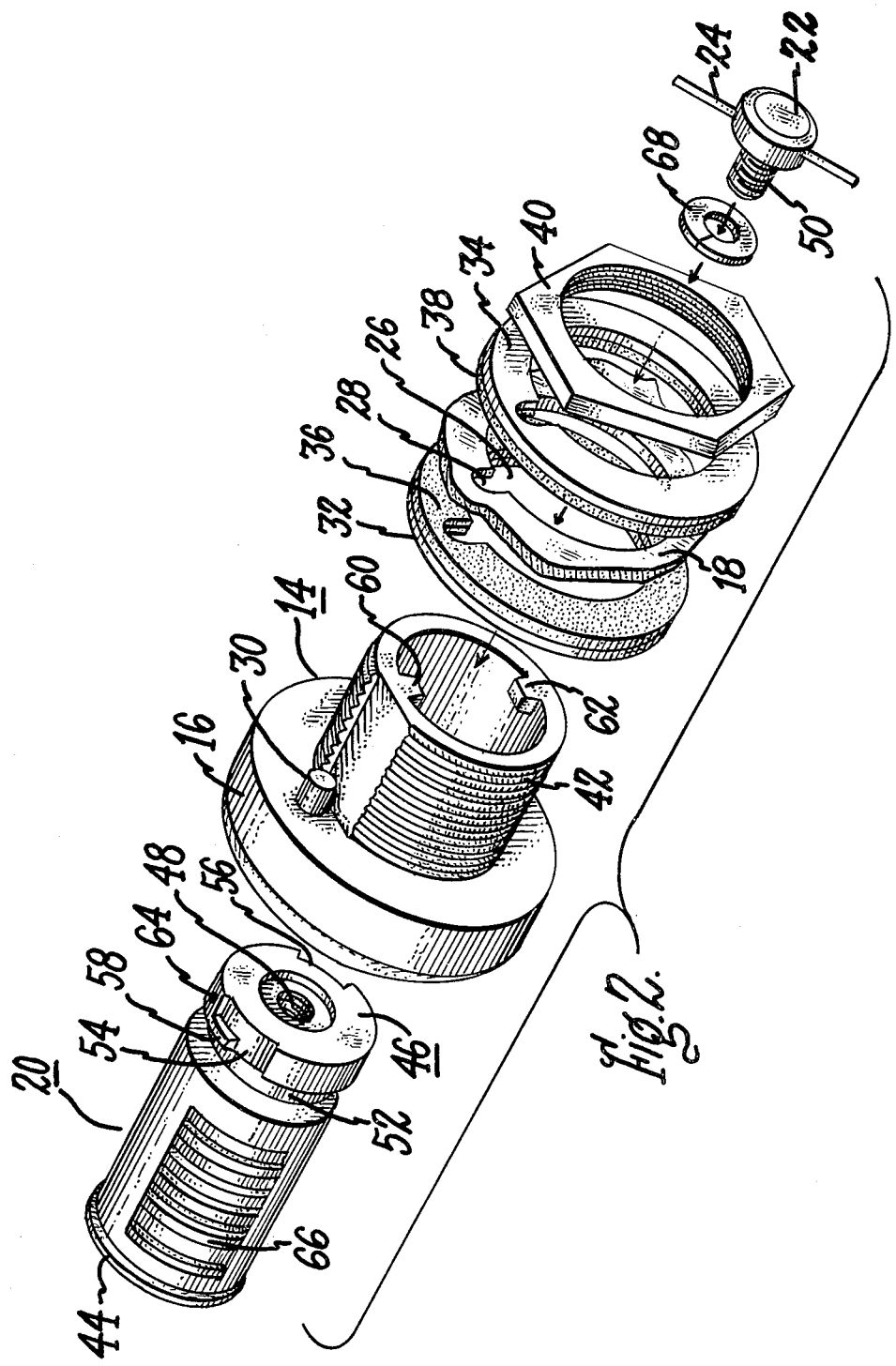
FIG. 2 is an exploded perspective view of the key-operated reset actuator of the preferred form of this invention.

Reference will now be made to the drawings, disclosing the present preferred embodiment of this invention, wherein like numerals are used to indicate like parts throughout the various views.

In FIG. 1 the key-operated reset actuator mechanism 10 is shown, including a key member 12 and a barrel member 14, including shoulder 16. Barrel member 14 extends through the glass cover 18, as shown, and a plug member 20, which has on its end an actuating member 22 including the pin actuator 24, is mounted in barrel member 14. As will be apparent from FIG. 1 and FIG. 2 the barrel number 14 extends through opening 26 in the glass cover 18. A slot 28 is provided in opening 26 and pin member 30 extends through such slot preventing rotation of the barrel within the glass cover 18. As can be seen, a pair of metal washers 32 and 34 and cork washers 36 and 38 are provided on opposite sides of the opening 26 and each are provided with a slot fitting on pin 30. A nut 40 is threaded on the inside of the glass cover along barrel 14 engaging the thread 42, as shown clearly in FIG. 1.

The plug member 20 is provided with a shoulder 44 which fits within the shoulder 16 of barrel 14. The plug member 20 extends through the barrel and the lower end 46 is provided with a threaded opening 48 which receives the threaded pin 50 of the actuator 22. This is rather clearly shown in FIG. 1 and indicated in the assembly view of FIG. 2. As can be seen plug member 20 is provided with a groove 52 which extends completely around plug member 20 on the lower portion. Also provided are slots 54 and 56, on opposite sides of bottom 46 which, as can be seen, extends into the groove 52. A ramp 58 is provided in each slot (only one shown in FIG. 2). As will be apparent, slots 54 and 56 cooperate with bosses 60, 62 on the interior of barrel 14 as shown in FIG. 2. As can be seen from FIG. 2, plug member 20 slides into barrel 14 and collar 44 will engage the collar 16 and groove 52 engages the bosses 60, 62 to prevent the plug from falling through the barrel. An opening 64 is provided in lower portion 46 of plug 20 to receive a pin (not shown) after the plug is assembled into the barrel to prevent removal of the plug 20 from the barrel 14.

As will be clear from FIG. 2 the barrel 14 is inserted through the cover 26 and is secured thereto by means of nut 40 with the washers 32, 36 on the exterior and the washers 34, 38 on the interior of the cover 18. Plug member 20 can then be inserted through the barrel and the slot 54, 56 will cooperate with bosses 60, 62 to maintain plug 20 in the barrel 14. As will be understood the tumblers 66 will cooperate with slots (not shown) in barrel 14 to maintain the plug 20 in position in barrel 14. As can be seen in FIG. 2 each of slots 54 and 56 are provided with a ramp 58 (only one shown) which will cooperate with bosses 60, 62 to enable plug 20 to be moved downwardly through the barrel until bosses 60, 62 engage the top of the groove 52 in barrel 20. The actuator 22 is secured in threaded opening 48 by threaded end 50. If desired a lock washer 68 may be provided to firmly hold the actuator 22 and 24 in position on the end of the plug 20.

As will be apparent from plug 20 FIG. 2 when the plug is rotated in a counter clockwise direction, in the direction of the arrow the plug will be rotated such that bosses 60, 62 will slide in the slot 54, 56 until hitting the edge thereof below ramp 58. When plug 20 is rotated clockwise then, as will be apparent, the bosses 60, 62 will move beyond ramp 58 allowing the plug 20 to drop through the barrel until bosses 60,62 rest against the top of groove 52. At the same time collar 44 will engage the interior portion of collar 16 of the barrel 14. In this position pin 24 of actuator 22 will engage the clock reset member 70, as shown in FIG. 4. As will be apparent, rotation of pin 24 will permit resetting of the clock dial (not shown) through clock reset member 70.

As noted rotation of plug 20 allows the plug 20 to move past bosses 60, 62, to allow plug 20 to move into the meter cover (to the right in FIG. 2). This inward movement allows pin 24 to engage clock reset member 70 to reset the clock (not shown). As will be apparent when bosses 60, 62 are in line with slots 54, 56, the plug can be moved outwardly to disengage rest member 70 and relock the key-operated unit mechanism 10. To enable an inexperienced person to use the key device a pair of indication marks are provided on the collar 16 of barrel 14. One of these marks, 72, is shown in FIG. 3. As will be clear, the other mark is under the key 12.

While there has been shown and described the present preferred embodiment of this invention, it will be apparent to those skilled in the art that various changes could be made without departing from the invention concept. For example, it will be obvious that bosses 60, 62 or barrel 14 and slots 54, 56 or plug 20, could be revised, if desired. Thus, it is intended to include all such modifications as fall within the spirit and scope of the invention as defined in the appended claim.

What is claimed as new and which is desired to be secured by Letters Patent of the United States is:

1. In combination with a watt-hour meter and time switch, the time switch including a time clock, the meter and time switch disposed inside a cover and a rotatable reset mechanism provided for said time clock, the improvement which comprises;
    a. a key-operated reset device mounted in said cover,
        1. the outer portion of said device having a slot for receiving a key therein,
        2. the inner portion of said device including a plug portion and having a rotary actuating means for rotating said rotatable reset mechanism of said time clock,
    b. said key operative to rotate the plug portion of said reset device to move the end of said plug into said cover whereby said rotary actuating means on said plug engages said rotatable reset mechanism of said time clock to allow resetting of said time clock.

* * * * *